United States Patent
Bonneau et al.

(10) Patent No.: US 6,750,301 B1
(45) Date of Patent: Jun. 15, 2004

(54) DIE ATTACH ADHESIVES WITH EPOXY COMPOUND OR RESIN HAVING ALLYL OR VINYL GROUPS

(75) Inventors: Mark R. Bonneau, Brea, CA (US); Yun K. Shin, Sherman Oaks, CA (US); Gina Hoang, Huntington Beach, CA (US); Martin Sobczak, Huntington Beach, CA (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 0 days.

(21) Appl. No.: 09/611,899

(22) Filed: Jul. 7, 2000

(51) Int. Cl.⁷ ............................................. C08L 63/10
(52) U.S. Cl. ..................... 525/526; 525/403; 525/523; 525/540; 525/406; 524/495; 524/439; 524/492; 524/425; 524/449; 524/445; 524/423; 524/437
(58) Field of Search ................ 524/440, 425, 524/435, 538, 539, 588, 187, 476, 524, 533, 406, 403

(56) References Cited

U.S. PATENT DOCUMENTS

| | | | | |
|---|---|---|---|---|
| 4,115,361 A | * | 9/1978 | Schulze et al. | 528/111 |
| 4,496,695 A | * | 1/1985 | Sugio et al. | 525/391 |
| 4,552,604 A | * | 11/1985 | Green | 156/246 |
| 4,564,563 A | * | 1/1986 | Martin et al. | 428/546 |
| 4,595,604 A | * | 6/1986 | Martin et al. | 427/96 |
| 4,595,606 A | * | 6/1986 | St. John et al. | 427/96 |
| 4,612,209 A | * | 9/1986 | Forgo et al. | 427/54.1 |
| 4,654,382 A | * | 3/1987 | Hiza et al. | 523/457 |
| 4,755,569 A | * | 7/1988 | Kanagawa et al. | 525/502 |
| 4,902,732 A | * | 2/1990 | Itoh et al. | 525/433 |
| 4,960,860 A | * | 10/1990 | Saito et al. | 528/353 |
| 5,034,473 A | * | 7/1991 | Schultz et al. | 525/423 |
| 5,043,102 A | * | 8/1991 | Chen et al. | 252/514 |
| 5,292,812 A | * | 3/1994 | Yamazaki et al. | 525/112 |
| 5,340,851 A | * | 8/1994 | Shiobara et al. | 523/443 |
| 5,439,956 A | | 8/1995 | Noguchi | 522/92 |
| 5,459,200 A | * | 10/1995 | St. Clair | 525/131 |
| 5,612,441 A | * | 3/1997 | Dochniak | 528/73 |
| 5,646,315 A | * | 7/1997 | Schultz et al. | 549/554 |
| 5,703,195 A | * | 12/1997 | Schultz et al. | 528/103 |
| 5,717,054 A | * | 2/1998 | Schultz | 528/100 |
| 5,744,533 A | * | 4/1998 | Iwamoto et al. | 524/440 |
| 5,783,713 A | * | 7/1998 | Schultz et al. | 549/554 |
| 5,843,251 A | * | 12/1998 | Tsukagoshi et al. | 156/64 |
| 5,863,970 A | * | 1/1999 | Ghoshal et al. | 523/434 |
| 6,214,904 B1 | * | 4/2001 | Tanaka et al. | 523/409 |
| 6,277,481 B1 | * | 8/2001 | Sugino et al. | 428/317.1 |
| 6,576,297 B1 | * | 6/2003 | Cameron et al. | 427/372.2 |

FOREIGN PATENT DOCUMENTS

| | | | | |
|---|---|---|---|---|
| EP | 0 919 873 A1 | | 2/1999 | |
| JP | 59-196378 A | * | 11/1984 | C09J/3/16 |
| JP | 0 919 873 A1 | * | 6/1999 | G03F/7/038 |

OTHER PUBLICATIONS

Rozen, S. Pure Appl. Chem. 1999, 71, 481.*
Database WPI Section Ch, Week 199819 Derwent Publications Ltd., London, GB; AN 1998–212867, XP002199236;b) File 'Caplus', STN International, AN 1998: 143481, DN 128:218176; c) JP 10 060138A.
a) Database WPI Section Ch, Week 198948 Derwent Publications Ltd., London, GB; AN 1989–351448, XP002199237; b) File 'Caplus', STN International, AN 1990:218332, DN 112:218332; c) JP 01 261429 A.
a) Database WPI Section Ch, Week 199932 Derwent Publications Ltd., London, GB; AN 1999–379910, XP002199238; b) File 'Caplus', STN International, AN 1999:345792, DN 131:19726; c) JP 11 147929 A.

* cited by examiner

Primary Examiner—David W. Wu
Assistant Examiner—Rip A Lee
(74) Attorney, Agent, or Firm—Jane E. Gennaro

(57) ABSTRACT

Adhesive compositions containing a base compound or resin and an epoxy compound or resin with allyl or vinyl functionality show enhanced adhesive strength. The compositions can be used in microelectronic applications.

2 Claims, No Drawings

DIE ATTACH ADHESIVES WITH EPOXY COMPOUND OR RESIN HAVING ALLYL OR VINYL GROUPS

FIELD OF THE INVENTION

This invention relates to die attach adhesives with improved adhesion due to the presence of epoxy compound or resin with allyl or vinyl unsaturation.

BACKGROUND OF THE INVENTION

Adhesive compositions are used for a variety of purposes in the fabrication and assembly of semiconductor packages, such as, the bonding of integrated circuit chips to leadframes or other substrates, and the bonding of circuit packages or assemblies to printed wire boards. Major requirements for these uses are fast cure and high adhesive strength, traditionally achieved with epoxy resins. Epoxy resins, however, can be brittle, and other resins have been evaluated and employed to bring flexibility, hydrophobicity, and other properties to die attach adhesives. The alternate resins, in turn, do not always display the strong adhesion provided by the epoxy resins. Therefore, there is a need for die attach adhesives that incorporate a balance of properties to meet all the requirements for an adhesive used in the manufacture of a semiconductor package.

SUMMARY OF THE INVENTION

This invention is an adhesive composition comprising (a) a compound or resin that will cure by free-radical polymerization, that is, one having carbon to carbon unsaturation, or that will cure by hydrosilation, that is, one having silicon-hydride groups, (b) an epoxy compound that contains allyl or vinyl unsaturation, (c) a curing agent for the compound or resin (a) and a curing agent for the epoxy compound or resin (b), and (d) optionally, one or more fillers. The composition may also contain adhesion promoters or coupling agents. The inventors discovered that the addition of the epoxy compound containing allyl or vinyl unsaturation gave an unexpected increase in adhesion performance to the base compound or resin containing the carbon to carbon unsaturation. In another embodiment, this invention is a semiconductor package having a semiconductor die adhered to a substrate with the inventive adhesive.

DETAILED DESCRIPTION OF THE INVENTION

Free-radical curable compounds or resins, which can be used as adhesives in microelectronic applications, include, for example, maleimides, such as those available from Ciba Specialty Chemicals; siloxanes and polysiloxanes, such as those available from from Gelest; polyethers, such as those available from from BASF; polyesters, such as those available from from Uniqema or Bayer; poly(butadiene)s, such as those available from from Elf-Atochem; polyurethanes, such as those available from from Bayer or BASF; and acrylate resins, such as those available from from Sartomer or UCB Radcure. Siloxanes and polysiloxanes, which cure by hydrosilation, may be linear or cylic polymers, and will have at least 2 silicone-hydride functionalities per molecule. The polyethers, polyesters, and polyurethanes preferably will contain terminal unsaturation, but may also contain unsaturation within the polymer chain. The particular compound or resin will be chosen by the practitioner to give specific material properties in a final formulation, such as, rheological properties, hydrophilic or hydrophobic properties, toughness, strength, or flexibility. The compound or resin will be present in the adhesive composition in a range of 10–80% by weight.

The epoxy compounds or resins may be any with allyl or vinyl functionality. Examples include 2,6-digylcidylphenyl allyl ether, glycidyl vinyl benzyl ether or glycidyl vinyl ether. The epoxy will be present in the adhesive composition in a range of 0.1–30% by weight.

Exemplary curing agents for the base compounds or resins are free-radical initiators, which can be thermal- or photo-Initiators. The initiators will be present in the adhesive composition in an amount of 0.1% to 10%, preferably 0.1% to 3.0%, by weight. Preferred thermal initiators Include peroxides, such as butyl peroctoates and dicumyl peroxide, and azo compounds, such as 2,2'-azobis(2-methyl-propanenitrile) and 2,2'-azobis(2-methyl-butanenitrile). A preferred series of photoinitiator is one sold under the trademark Irgacure by Ciba Specialty Chemicals. In some formulations, both photocure and thermal cure may be desirable, for example, the curing process can be started by irradiation, and in a later processing step curing can be completed by the application of heat.

Exemplary curing agents for the epoxy functionality on the epoxy compound or resin are Lewis bases, for example, amines, such as Ancamine 2337xs, and 4,4'-bis(para amino cyclohexyl)methane, both commercially available from Air Products; imidazoles, such as Curezol 2E4MZ-CN, a product of Shikoku Chemicals; amides, such as, Dicyanamide, a product of Air Products; polyamides, such as Versamide 140, a product of Henkel; tertiary amines, such as Amicure DBU, a product of Air Products. Alternatively, Lewis acids, such as Rhodorasll 2074[(tolylcumyl)iodonium tetrakis (pentafluorophenyl)borate], a product of Rhodia, or GE UV9380C, a product of General Electric, can be used to initiate a cationic cure. The curing agent for the epoxy functionality will be present in the composition in a range of 0.1 to 3% by weight of the total formulation, In general, these compositions will cure within a temperature range of 70° C. to 250° C., and curing will be effected within a range of ten seconds to three hours. The time and temperature curing profile of each formulation will vary with the components of the formulation, but the parameters of a curing profile can be adjusted by a practitioner skilled in the art without undue experimentation.

In some compositions it may be desirable to add organic or inorganic fillers. Suitable conductive fillers are carbon black, graphite, gold, silver, copper, platinum, palladium, nickel, aluminum, silicon carbide, boron nitride, diamond, and alumina. Suitable nonconductive fillers are particles of vermiculite, mica, wollastonite, calcium carbonate, titania, sand, glass, fused silica, fumed silica, barium sulfate, and halogenated ethylene polymers, such as tetrafluoroethylene, trifluoroethylene, vinylidene fluoride, vinyl fluoride, vinylidene chloride, and vinyl chloride. Although optional, when present, fillers will be in amounts of 20% to 90% by weight of the composition.

Suitable adhesion promoters or coupling agents are silanes, silicate esters, metal acrylates or methacrylates, titanates, and compounds containing a chelating ligand, such as phosphine, mercaptan, and acetoacetate. When present, coupling agents will be in amounts up to 10% by weight, and preferably in amounts of 0.1% to 3.0% percent by weight.

The invention is further illustrated by the following examples, which are not intended as a limitation on the invention.

EXAMPLES

Semiconductor packages, consisting of a silicon die adhered to a bond pad on a leadframe with an adhesive, the die and the leadframe encapsulated in a molding compound, are tested for reliability using a test protocol of JEDEC Solid State Technology Association identified as JESD22-A112. In this method, the semiconductor package is subjected to 85° C. and 85% relative humidity for 168 hours followed by exposure to 240° C. in an infared oven using a standard solder reflow ramped profile of five minutes. Reliability failure of the package manifests itself as delamination of any of the package interfaces or as cracked molding compound.

Previous experiments of the inventors testing for failure of the adhesive adhering the die to the leadframe were conducted using unencapsulated assemblies of a die adhered to a leadframe with die attach adhesives. In these experiments, the unencapsulated assemblies were cured in an oven at 175° C. for 30 minutes. After cure, the assemblies were divided into two groups. The first group was tested for die shear strength after exposure to a hot dry environment, which consisted of 240° C. for one minute, followed by 175° C. for four hours.

The second group was tested for die shear strength after exposure to a hot wet environment, which consisted of 85% relative humidity at 85° C. for 168 hours.

After exposure, each group of assemblies was heated to 250° C., after which the die was sheared from its substrate. Some of the assemblies exhibited cohesive mode failure of the adhesive adhering the die to the leadframe, others exhibited adhesive mode failure of the adhesive adhering the die to the leadframe.

Those adhesives that failed in a cohesive mode correlated with higher reliability in the JEDEC test method on encapsulated packages using the same adhesive, while the adhesives that failed in the adhesive mode giving a clean metal surface, correlated with lower reliability in the JEDEC test method on encapsulated packages using the same adhesive.

In the following examples, formulations with and without the epoxy with allyl or vinyl functionality were tested for hot dry die shear strength (measured in kg of force), and for hot wet die shear strength using the above described protocols. The die used was a silicon die, 12.5 mm×12.5 mm×0.38 mm adhered to a bare copper or a silver-plated leadframe.

The adhesive composition and performance test data are set out in the following tables and show that the adhesive formulations containing epoxy with allyl or vinyl functionality failed during hot wet die shear testing in a cohesive mode, while the formulations without the epoxy containing allyl or vinyl functionality failed in an adhesive mode. Therefore, the data indicate that the formulations containing the epoxy compound with vinyl or allyl unsaturation improve adhesive performance and semiconductor package reliability. The compositions are reported in weight percent.

| COMPOSITION Ex.1 | With epoxy resin with allyl functionality | With epoxy resin without allyl functionality |
|---|---|---|
| proprietary bismaleimide | 19.04% | 19.04% |
| 4,4'-bismaleimido-diphenylmethane | 0.52% | 0.52% |
| (2,6-diglycidylphenyl allyl ether) epoxy resin | 1.2% | — |
| bis-phenol-F epoxy resin | — | 1.57% |
| poly(budadiene) (Ricon 130) | 2.61% | 2.61% |
| polyester vinyl ether resin (Allied signal VE1312) | 1.57% | 1.57% |
| adduct of cinnamyl alcohol with dimer diisocyanate | 3.39% | 3.39% |
| methacryloxy silane (Witco A-174) | 0.4% | 0.4% |
| 1,1-di(t-amyl peroxy) cyclohexane (Witco USP90MD) | 0.65% | 0.65% |
| 2-ethyl 4-methyl imidazole-CN | 0.25% | 0.25% |
| silver flake | 70% | 70% |
| Total | 100% | 100% |

| PERFORMANCE Ex.1 | Silver-plated leadframe | Bare Copper leadframe | Silver-plated leadframe | Bare Copper leadframe |
|---|---|---|---|---|
| Cured for 30 minutes/ 175° C. Die warpage @ RT | 15.5 μ | 8.3 μ | 18.6 μ | 7.1 μ |
| Hot Dry Die Shear @ 250 C. | 14.1 kg cohesive | 12.3 kg cohesive | 1.3 kg adhesive | 1.8 kg adhesive |
| Hot Wet Die Shear @ 250 C. | 7.3 kg cohesive | 6.24 kg cohesive | 1.3 kg adhesive | 1.6 kg adhesive |

| COMPOSITION EX.2 | With epoxy resin with allyl functionality | With epoxy resin without allyl functionality |
|---|---|---|
| polybutadiene with acrylate functionality (Ricon, 1756) | 10.5% | 10.5% |
| polybutadiene with maleic anhydride functionality (Ricon, 130MA10) | 2.0% | 2.0% |
| 1,6-diol diacrylate (Sartomer SR238) | 2.0% | 2.0% |
| isobornyl acrylate (Sartomer SR506) | 5.0% | 5.0% |
| 1,1-di(t-amyl peroxyl) cyclohexane (Witco USP, 90MD) | 0.5% | 0.5% |
| lauryl acrylate (Sartomer SR335) | 2.5% | 2.5% |
| 2,6-diglycidylphenyl allyl ether | 2.0% | 0% |
| 2-ethyl 4-methyl imidazole-CN | 0.2% | 0% |
| silver flake | 75% | 75% |
| Total | 100% | 100% |

| PERFORMANCE Ex.2 | Silver-plated leadframe | Bare Copper leadframe | Silver-plated leadframe | Bare Copper leadframe |
|---|---|---|---|---|
| Die Warpage at room temp. Cured for 30 minutes/ 175° C. | | 22.5 μ | | 17.0 μ |
| Plus 1 minute/220° C. or | | 26.6 μ | | 17.5 μ |
| Plus 4 hours/174° C. *delaminated | | 19.7 μ | | 12.1 μ |
| Hot Dry Die Shear @ 250 C. failure mode | | 6.6 kg cohesive | | 1.3 kg adhesive |
| Hot Wet Die Shear @ 250 C. failure mode | | 2.8 kg cohesive | | 1 kg adhesive |

|  | With epoxy resin with allyl functionality | With epoxy resin without allyl functionality |
|---|---|---|
| COMPOSITION Ex.3 | | |
| Sycar resin* | 13.96 | 11.56 |
| Polybutadiene (Ricon Resins, Ricon 130) | 2.33 | 1.93 |
| Poly(butadiene) functionalized with maleic anhydride (Ricon Resins, Ricon 130/MA8) | 1.4 | 1.16 |
| Poly(butadiene) functionalized with maleic anhydride (Ricon Resins, Ricon 130/MA 20 | 0.23 | 0.20 |
| Diallyl bisphenol-A (Bi-Max) | 1.63 | 1.35 |
| Divinyl ether (ISP Tech, DVE-3) | 1.16 | 0.96 |
| (2,6-diglycidylphenyl allyl ether) epoxy | — | 2.90 |
| 1,3-bis (glycidoxypropyl) - tetramethyldisiloxane (Gelest, SIB 1115.0) | — | 0.58 |
| Rhodorsil 2074 (Rhone Poulenc) | — | 0.6 |
| fumed silica (Degussa, 812S) | 0.5 | 0.5 |
| silver powder (Chemet, K-0082P) | 78 | 78 |
| platinum complex* (Sivento Inc., CPC 085) | 0.4 | 0.4 |
| platinum complex* (Sivento Inc. CPS 925-P) | 0.4 | 0.4 |
| Total | 100% | 100% |
| PERFORMANCE Ex. 3** | | |
| Die Shear Strength @ 200° C., 360 × 360 mil Si die on PBGA after 48 hrs at 85/85 | 17.0 ± 1.5 | 15.3 ± 3.2 |
| Failure mode | Adhesive to die backside | Peel off 80% solder mask |

*The stock solution as received was diluted with cyclic methylvinylsiloxanes to achieve ~5000 ppm Pt concentration.
**The adhesive compositions were dispensed on a metal lead frame and cured in a convection oven by ramping from room temperature to 175 C. over 30 minutes then holding at 175 C. for 15 minutes.

What is claimed is:

1. A die attach adhesive composition comprising:
   (a) a maleimide or polyether compound or resin, present in an amount of 10% to 80% by weight;
   (b) an epoxy compound or resin having vinyl or allyl functionality, selected from the group consisting of 2,6-digylcidylphenyl allyl ether, glycidyl vinyl benzyl ether, and gylcidyl vinyl ether, present in an amount of 0.1% to 30% by weight;
   (c) a curing agent for the epoxy compound or resin (b), present in an amount of 0.1% to 3% by weight;
   (d) a curing agent for the maleimide or polyether compound or resin (a), present in an amount of 0.1% to 10% by weight; and
   (e) optionally, a filler, present in an amount of 20% to 90% by weight.

2. The die attach adhesive according to claim 1 in which the filler is present and is selected from the group consisting of carbon black, graphite, gold, silver, copper, platinum, palladium, nickel, aluminum, silicon carbide, boron nitride, diamond, alumina, vermiculite, mica, wollastonite, calcium carbonate, titania, sand, glass, fused silica, fumed silica, barium sulfate, tetrafluoroethylene, trifluoroethylene, vinylidene fluoride, vinyl fluoride, vinylidene chloride, and vinyl chloride.

* * * * *